United States Patent
Kursun et al.

(10) Patent No.: US 7,218,151 B1
(45) Date of Patent: May 15, 2007

(54) DOMINO LOGIC WITH VARIABLE THRESHOLD VOLTAGE KEEPER

(75) Inventors: Volkan Kursun, Rochester, NY (US); Eby G. Friedman, Rochester, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 10/608,421

(22) Filed: Jun. 30, 2003

Related U.S. Application Data

(60) Provisional application No. 60/391,953, filed on Jun. 28, 2002.

(51) Int. Cl.
  *H07K 19/096* (2006.01)
(52) U.S. Cl. ............... 326/95; 326/97; 326/98
(58) Field of Classification Search ............. 326/93–98
  See application file for complete search history.

(56) References Cited

U.S. PATENT DOCUMENTS 6,204,696 B1 * 3/2001 Krishnamurthy et al. ..... 326/98
6,346,831 B1 * 2/2002 Krishnamurthy et al. ..... 326/98

OTHER PUBLICATIONS

V. Kursun and E. G. Friedman, "Domino Logic with Variable Threshold Voltage Keeper," IEEE Transactions on Very Large Scale Integration (VLSI) Systems (in press).
V. Kursun and E. G. Friedman, "Variable Threshold Voltage Keeper for Contention Reduction in Dynamic Circuits," Proceedings of the IEEE International ASIC/SOC Conference, pp. 314-318, Sep. 2002.
V. Kursun and E. G. Friedman, "Domino Logic with Dynamic Body Biased Keeper," Proceedings of the European Solid-State Circuits Conference, pp. 675-678, Sep. 2002.

* cited by examiner

*Primary Examiner*—Anh Q. Tran
(74) *Attorney, Agent, or Firm*—Blank Rome LLP

(57) ABSTRACT

A variable threshold voltage keeper circuit technique is proposed for simultaneous power reduction and speed enhancement of domino logic circuits. The threshold voltage of the keeper transistor is dynamically modified during circuit operation to reduce the contention current without sacrificing noise immunity. The threshold voltage of the keeper transistor is controlled by a body bias generator which switches between two voltages in accordance with the clock signal.

7 Claims, 14 Drawing Sheets

A footless domino logic circuit based on the dynamic forward body biased keeper domino logic (DFBBKD) circuit technique.

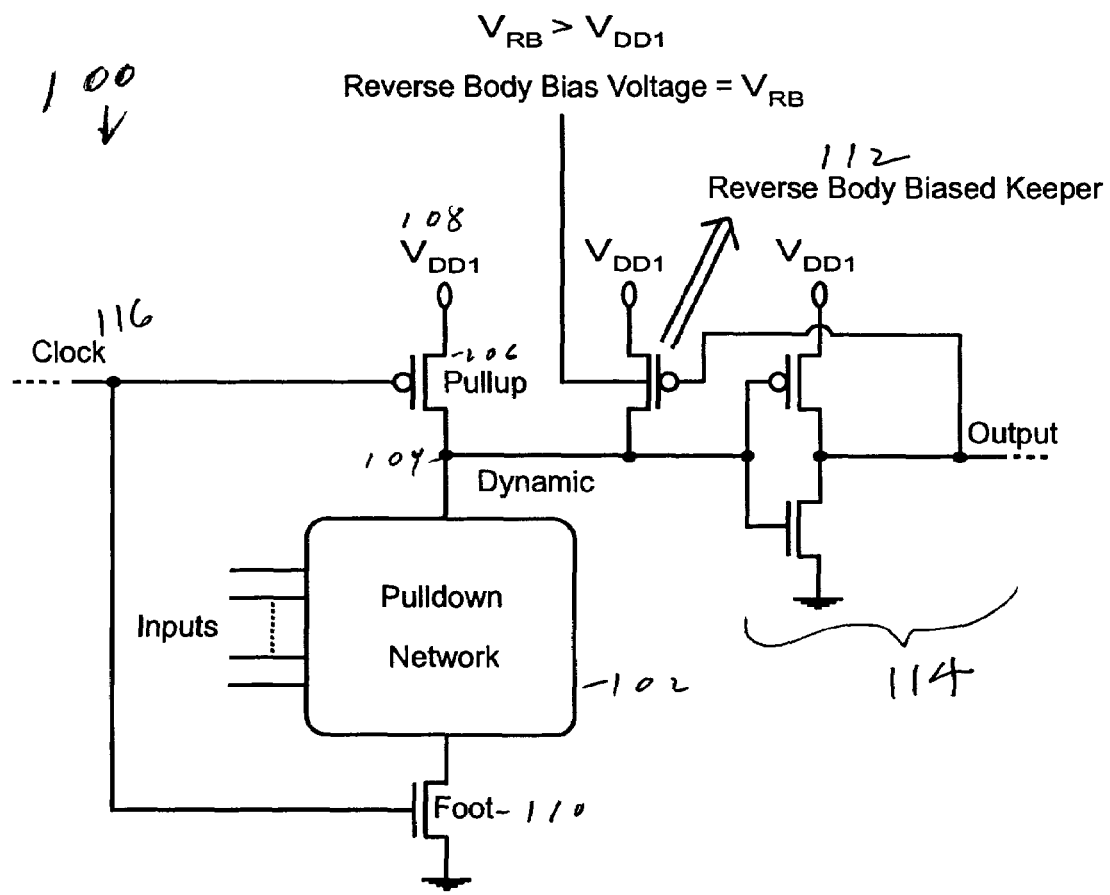
Fig. 1. A footed domino logic circuit based on the reverse body biased keeper domino logic (RBBKD) circuit technique.

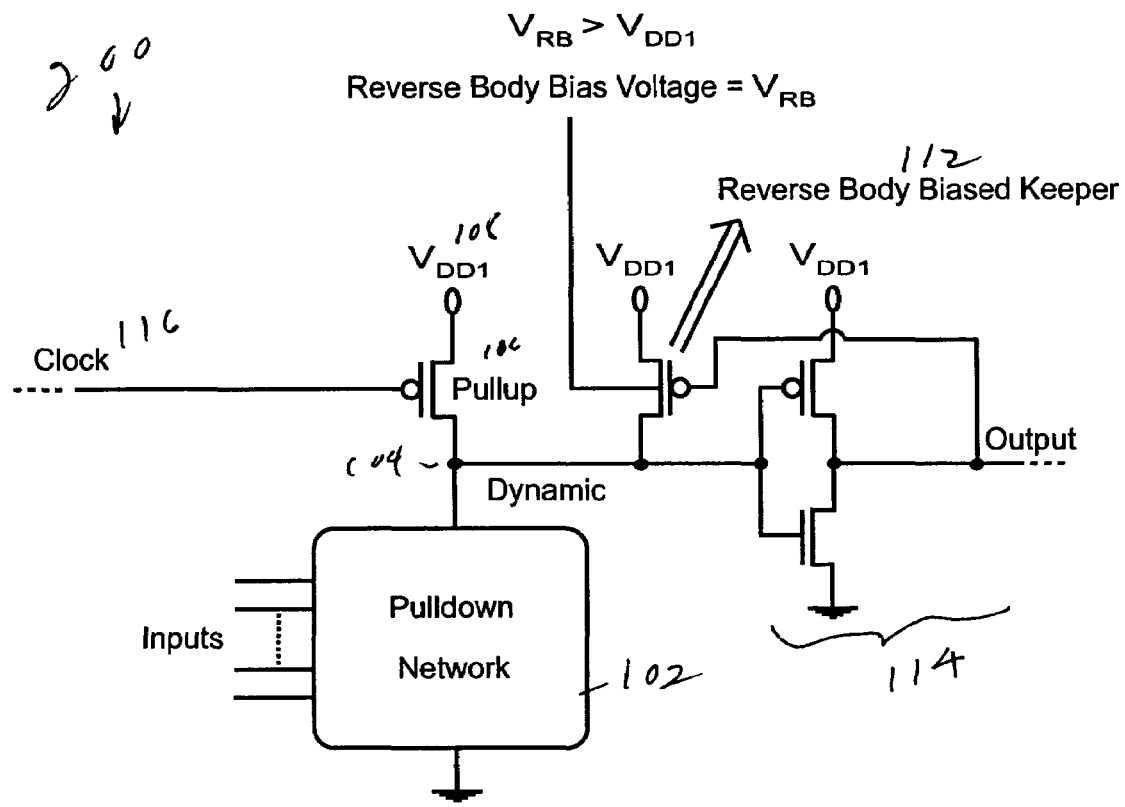
Fig. 2. A footless domino logic circuit based on the reverse body biased keeper domino logic (RBBKD) circuit technique.

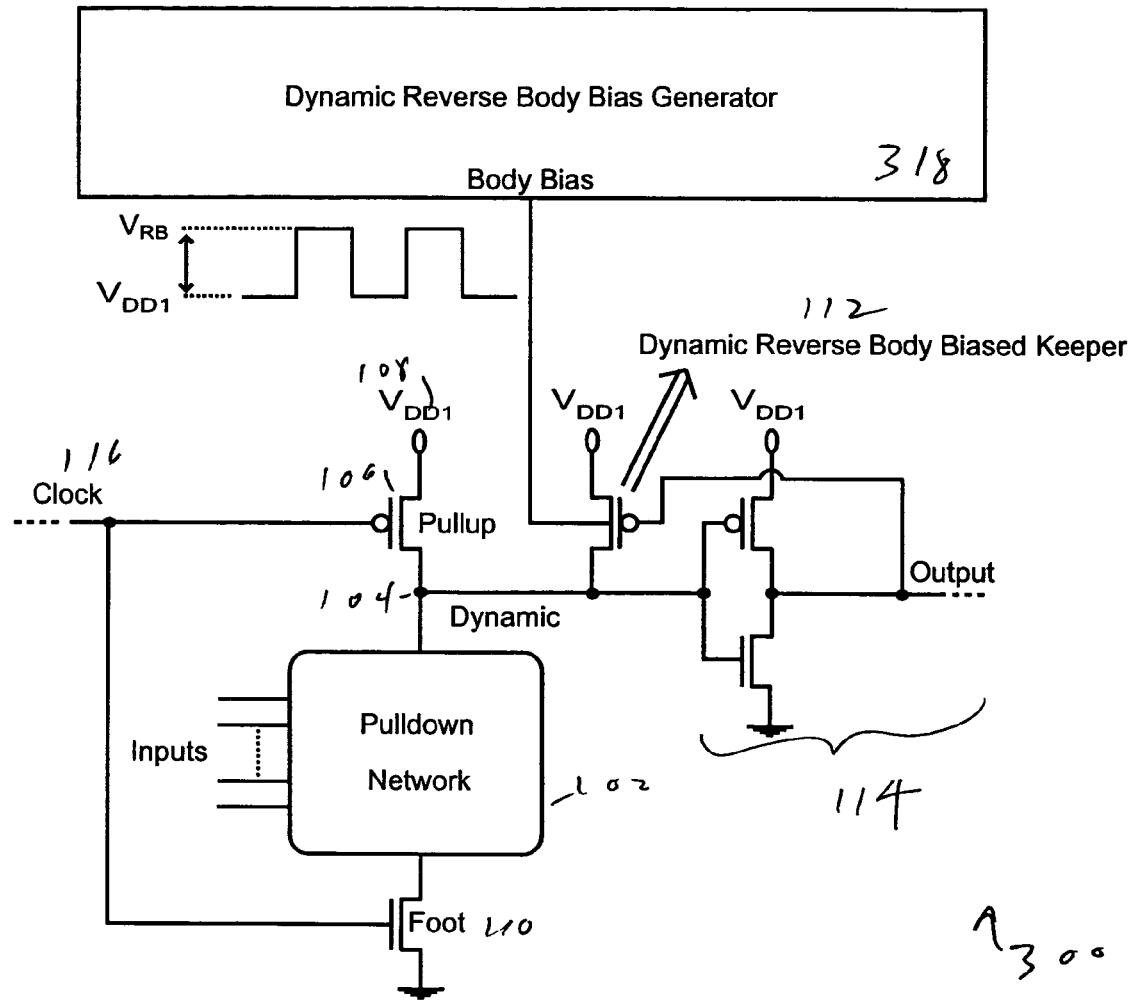
Fig. 3. A footed domino logic circuit based on the dynamic reverse body biased keeper domino logic (DRBBKD) circuit technique.

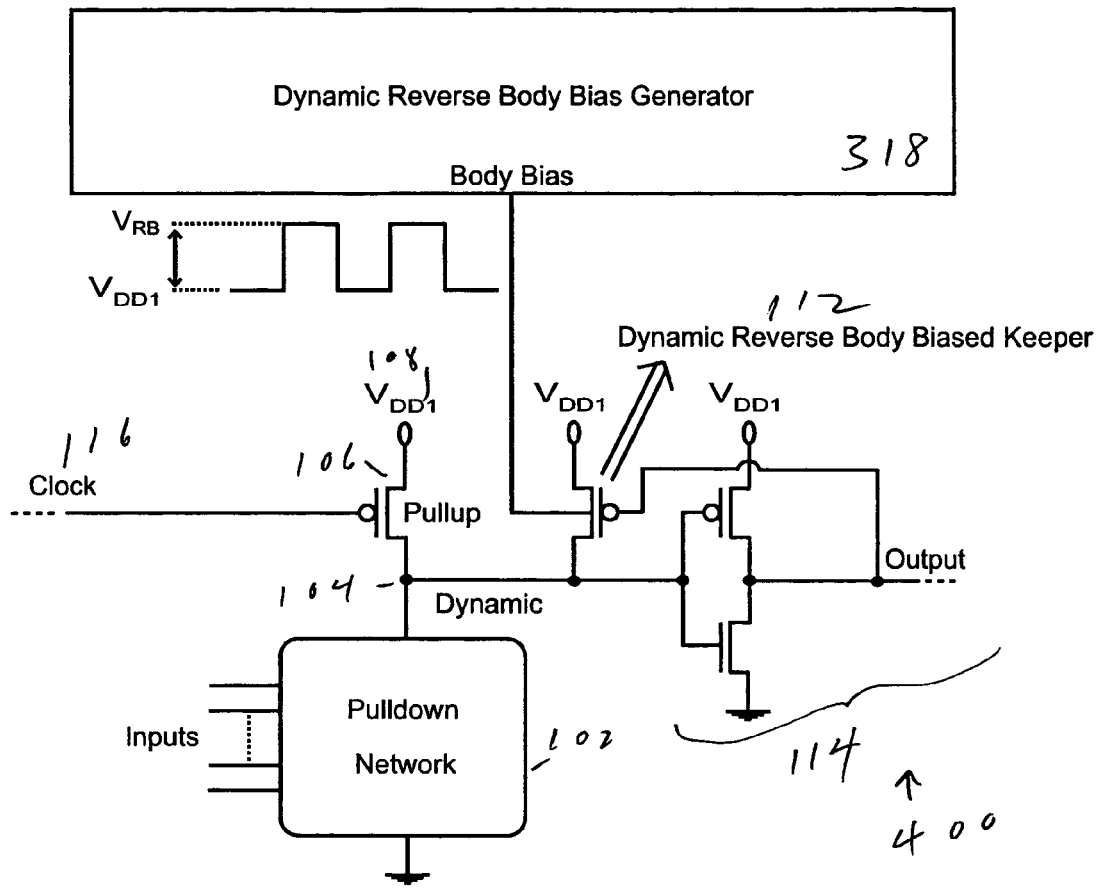
Fig. 4. A footless domino logic circuit based on the dynamic reverse body biased keeper domino logic (DRBBKD) circuit technique.
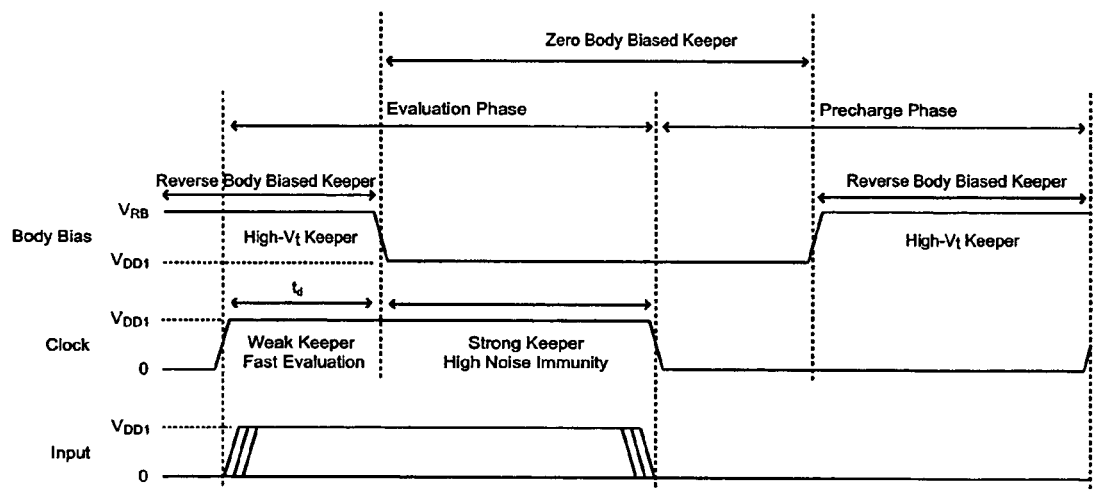
Fig. 5. Waveforms that characterize the operation of the proposed dynamic reverse body biased keeper domino logic (DRBBKD) circuit technique.

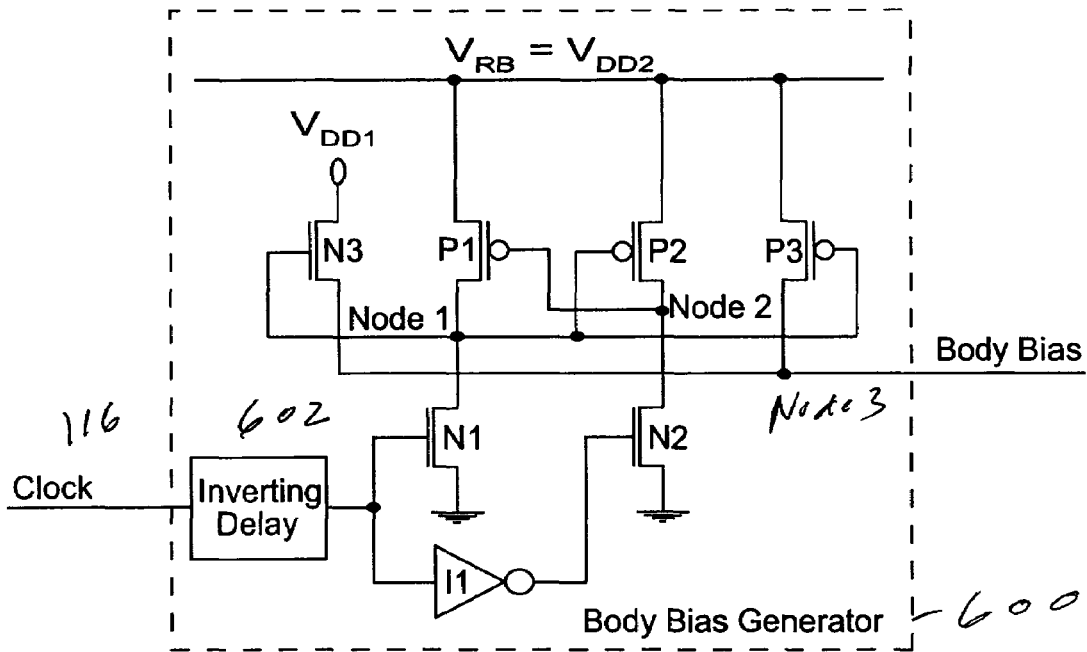

Fig. 6. A body bias generator applicable to the proposed dynamic reverse body biased keeper domino logic (DRBBKD) circuit technique [$V_{DD1} < V_{DD2}$ and $V_{tN3} < (V_{DD2} - V_{DD1})$].

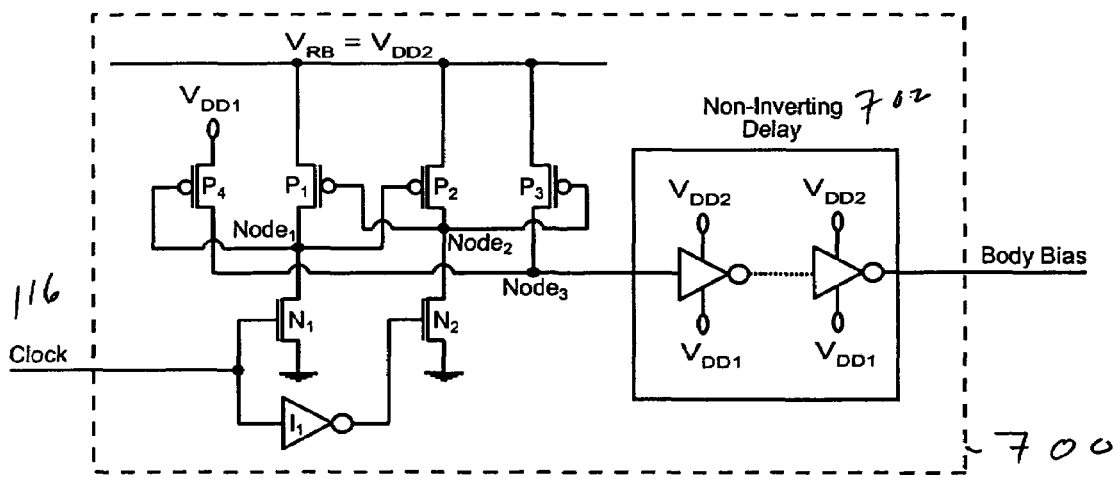

Fig. 7. A body bias generator applicable to the proposed dynamic reverse body biased keeper domino logic (DRBBKD) circuit technique ($V_{DD1} < V_{DD2}$). The body of $P_4$ can be connected either to $V_{DD2}$ or to $Node_3$ in order to not turn on the source-to-body diode of $P_4$ when $Node_3$ transitions to $V_{DD2}$.

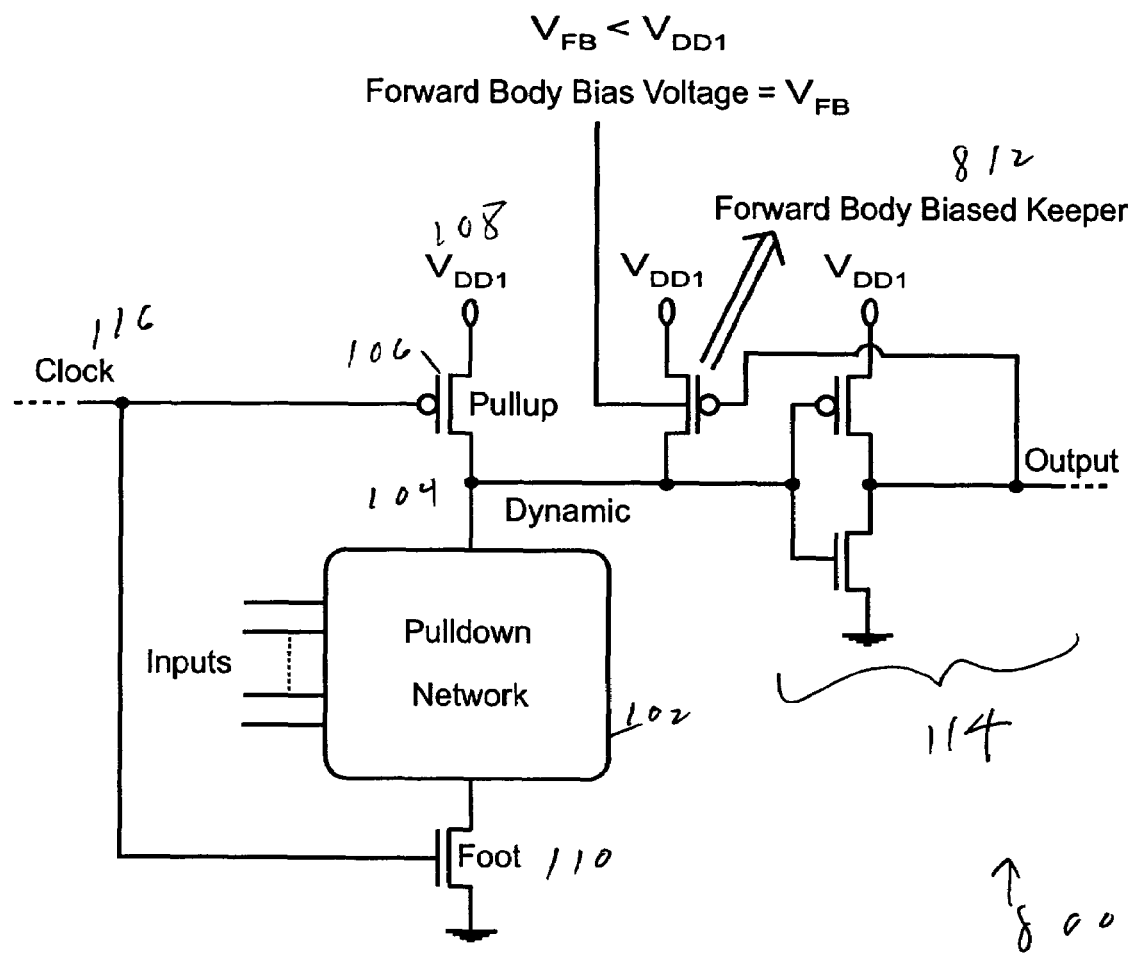
Fig. 8. A footed domino logic circuit based on the forward body biased keeper domino logic (FBBKD) circuit technique.

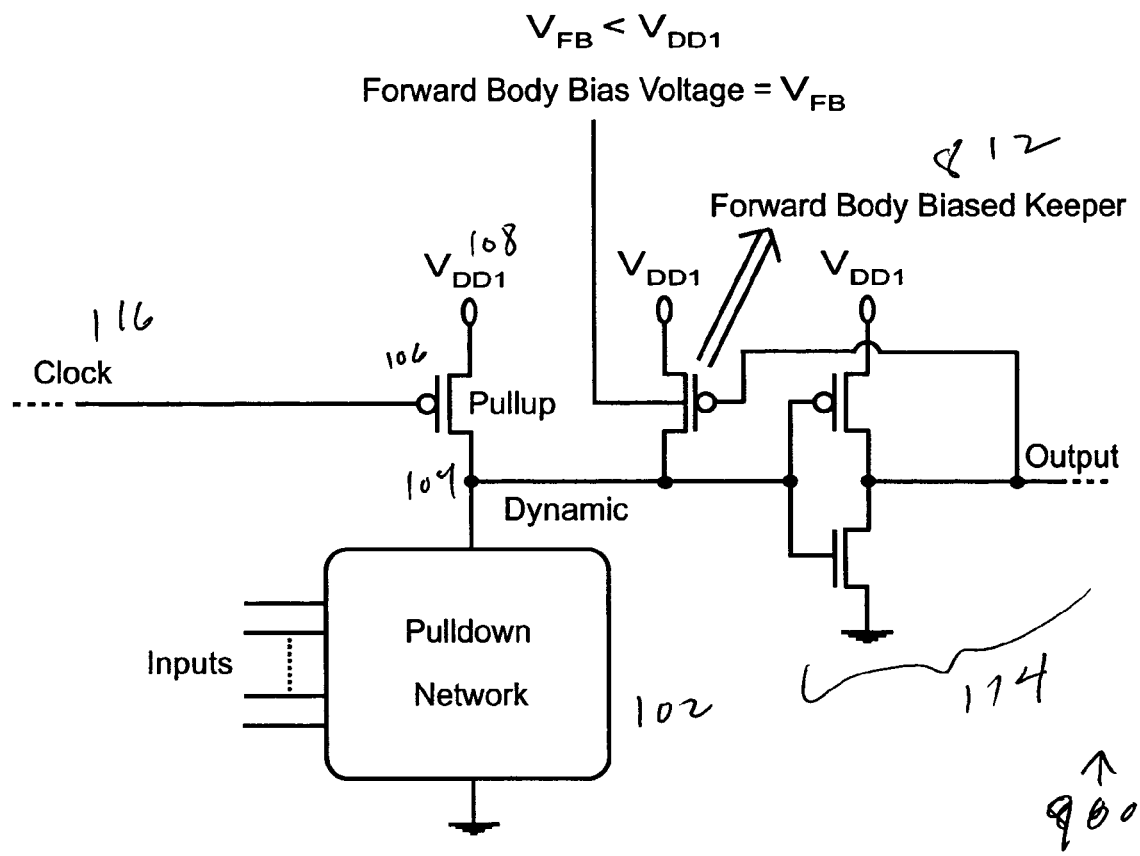
Fig. 9. A footless domino logic circuit based on the forward body biased keeper domino logic (FBBKD) circuit technique.

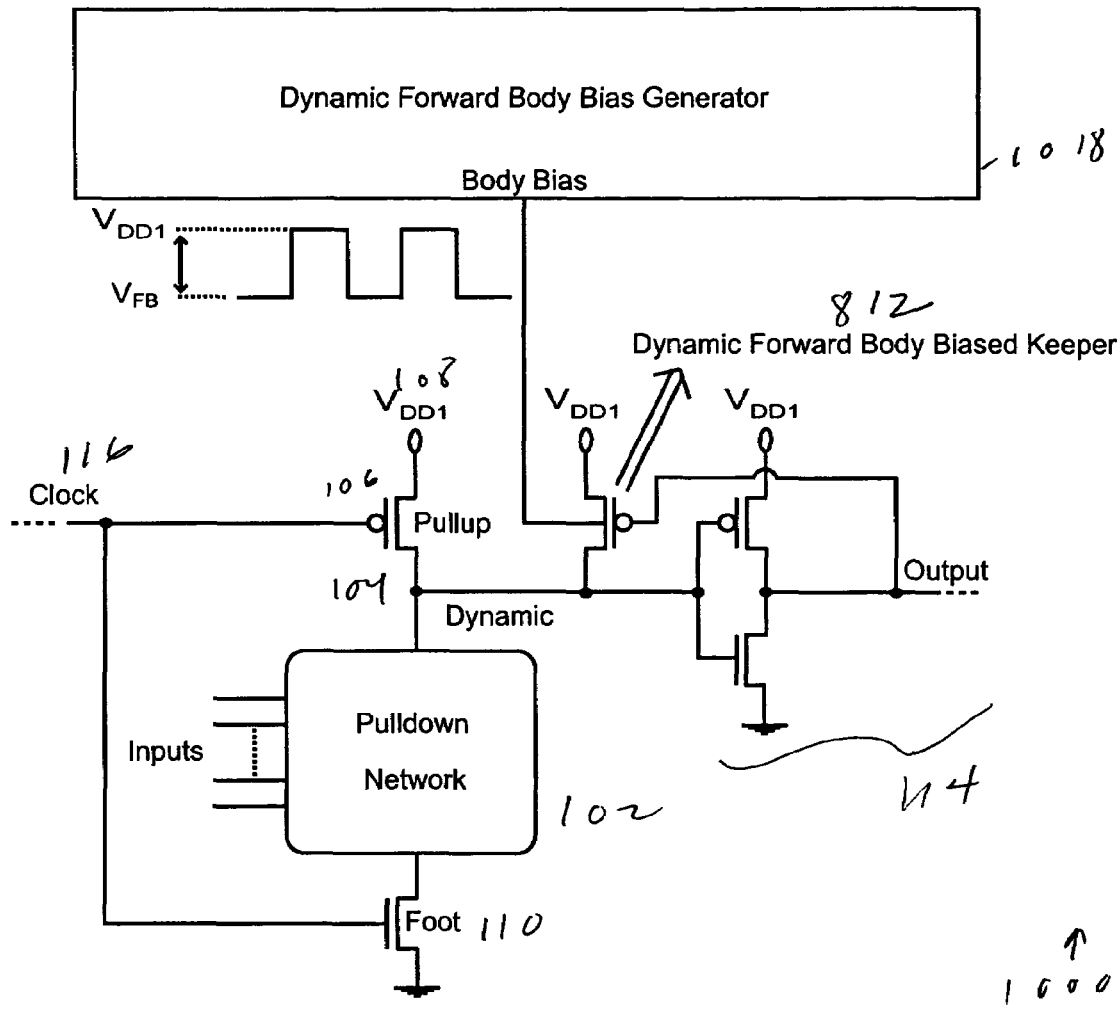
Fig. 10. A footed domino logic circuit based on the dynamic forward body biased keeper domino logic (DFBBKD) circuit technique.

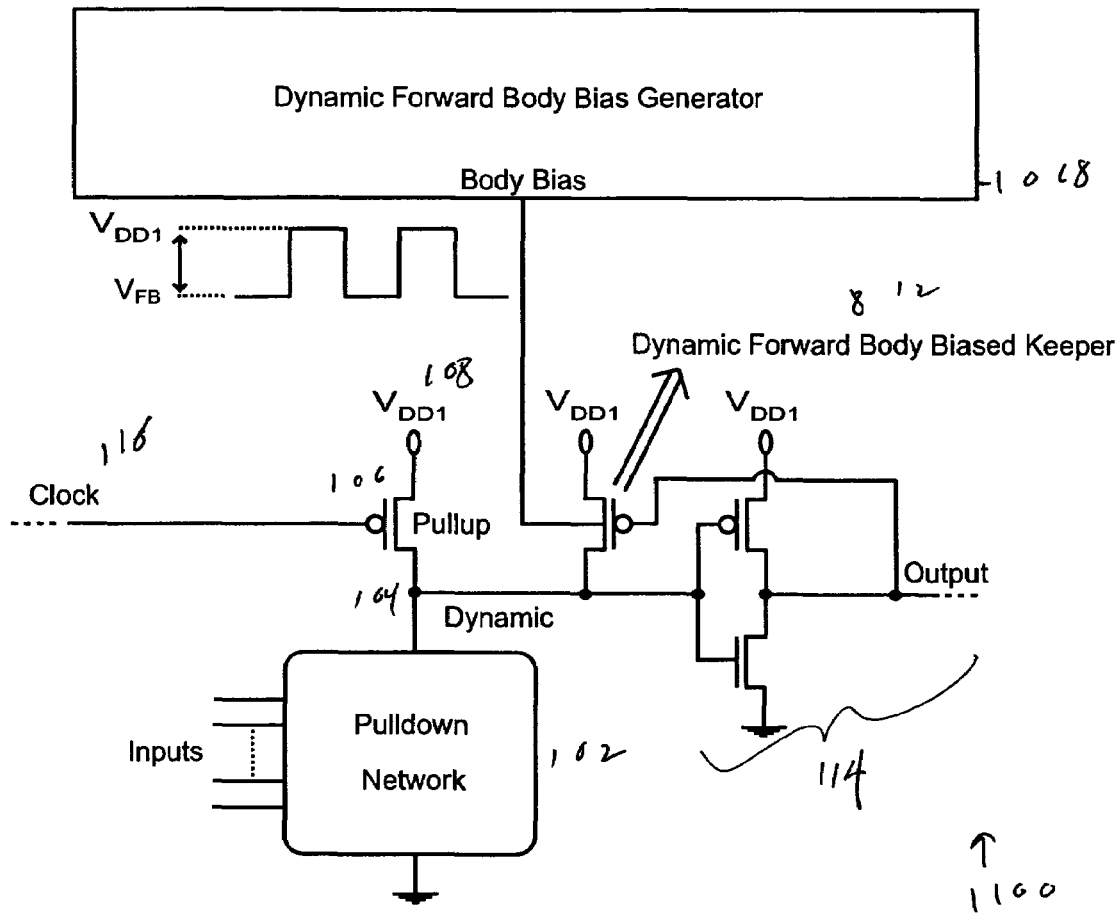
Fig. 11. A footless domino logic circuit based on the dynamic forward body biased keeper domino logic (DFBBKD) circuit technique.
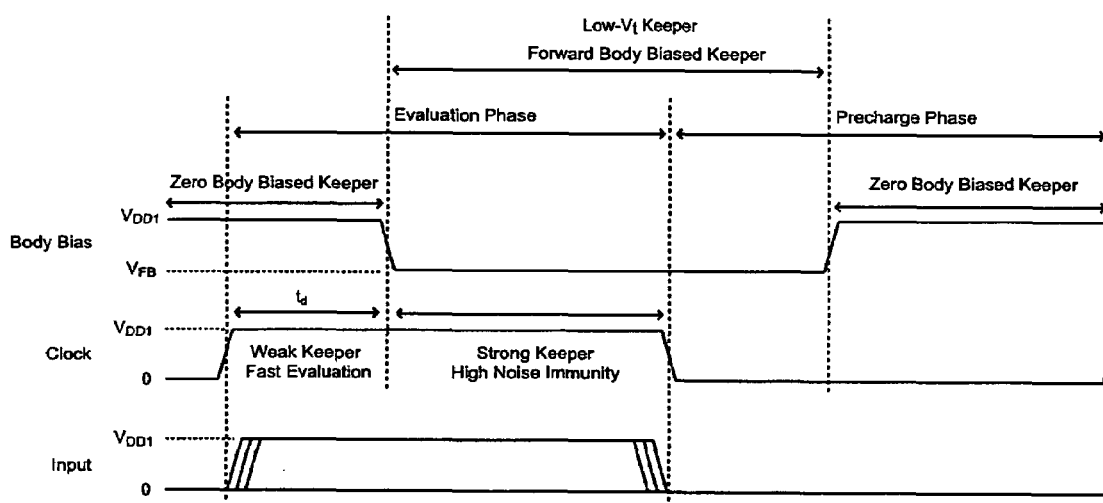
Fig. 12. Waveforms that characterize the operation of the proposed dynamic forward body biased keeper domino logic (DFBBKD) circuit technique.

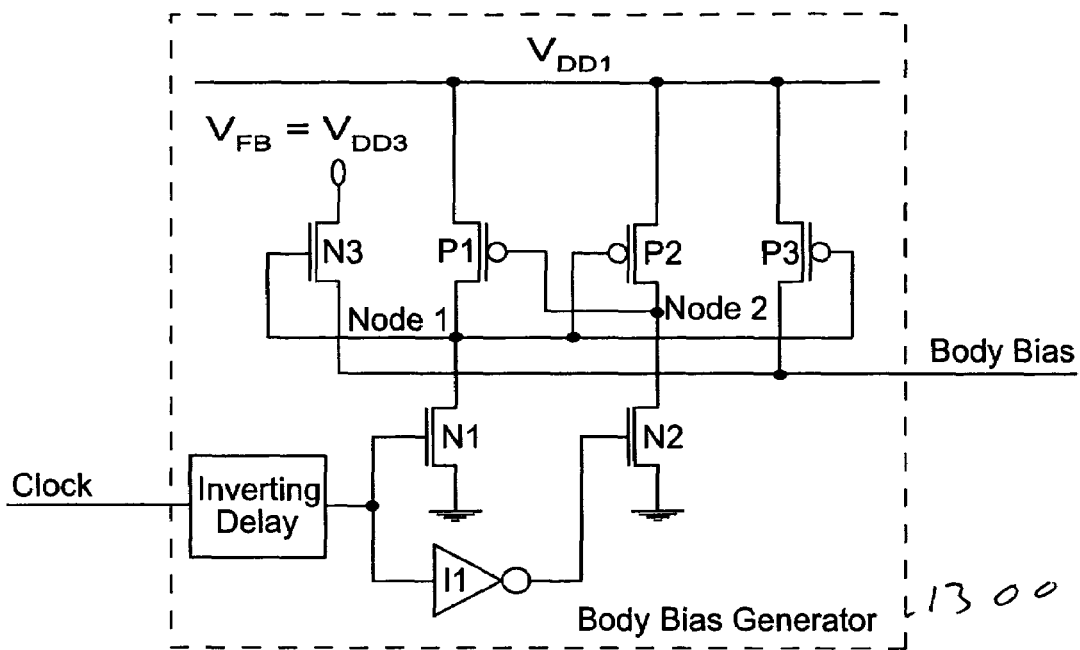

Fig. 13. A body bias generator applicable to the proposed dynamic forward body biased keeper domino logic (DFBBKD) circuit technique [$V_{DD3} < V_{DD1}$ and $V_{tN3} < (V_{DD1}-V_{DD3})$].

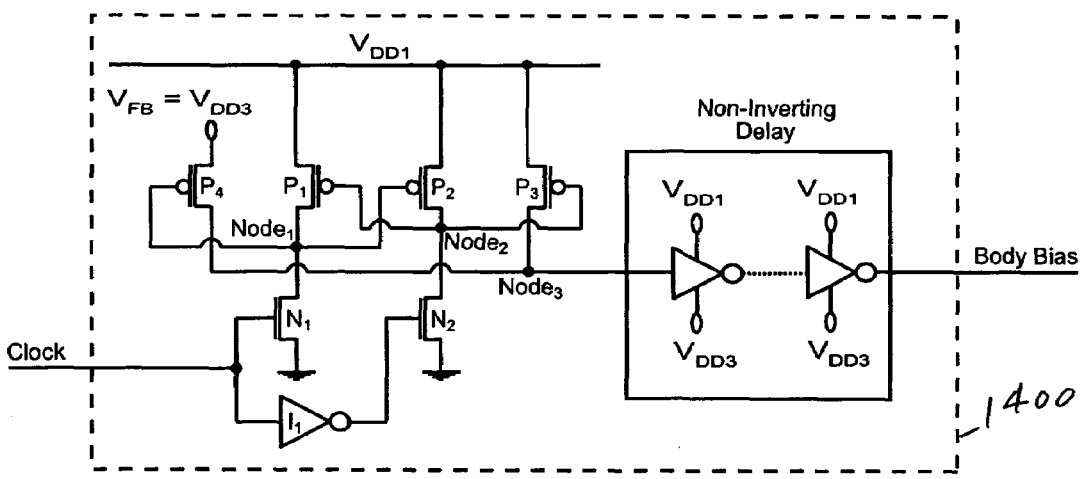

Fig. 14. A body bias generator applicable to the proposed dynamic forward body biased keeper domino logic (DFBBKD) circuit technique ($V_{DD3} < V_{DD1}$). The body of $P_4$ can be connected either to $V_{DD1}$ or to $Node_3$ in order to not turn on the source-to-body diode of $P_4$ when $Node_3$ transitions to $V_{DD1}$.

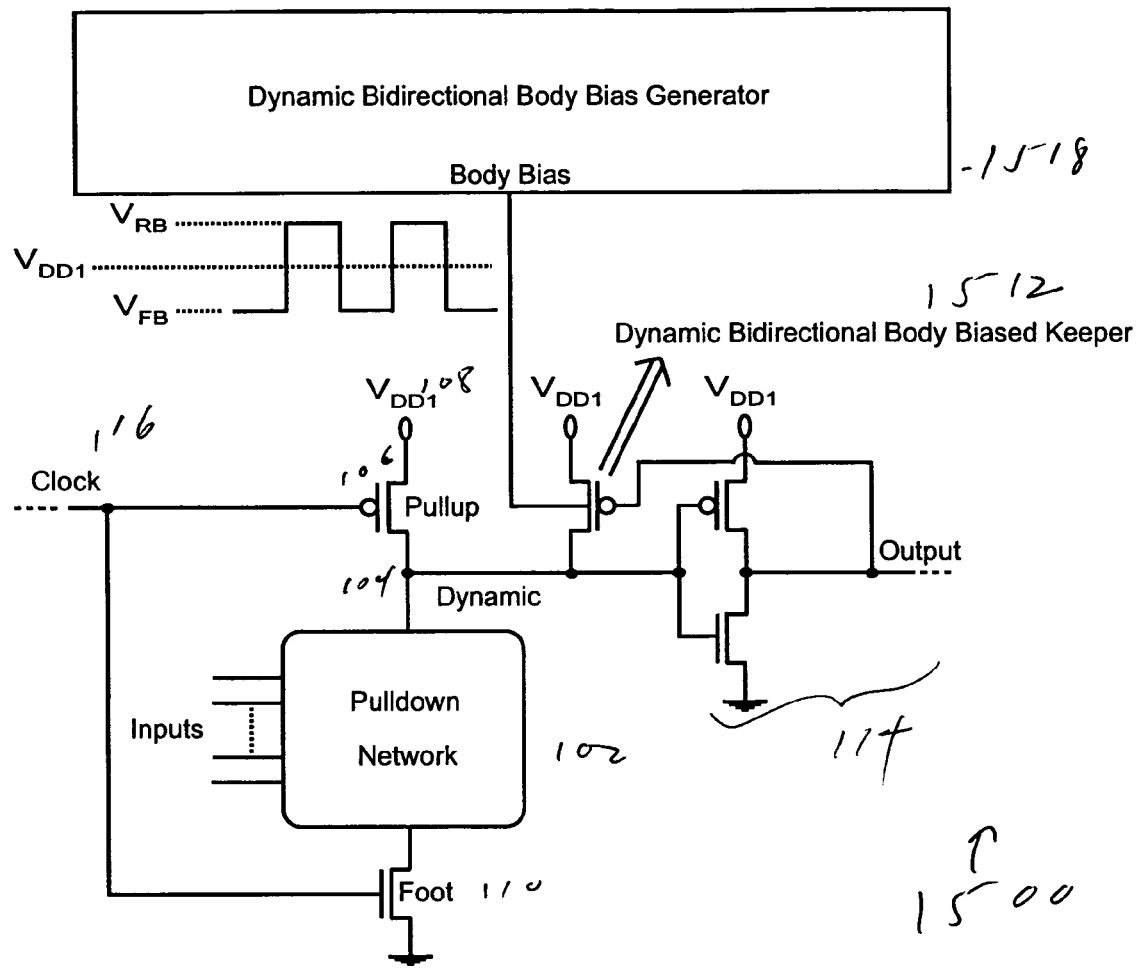
Fig. 15. A footed domino logic circuit based on the dynamic bidirectional body biased keeper domino logic (DBBBKD) circuit technique.

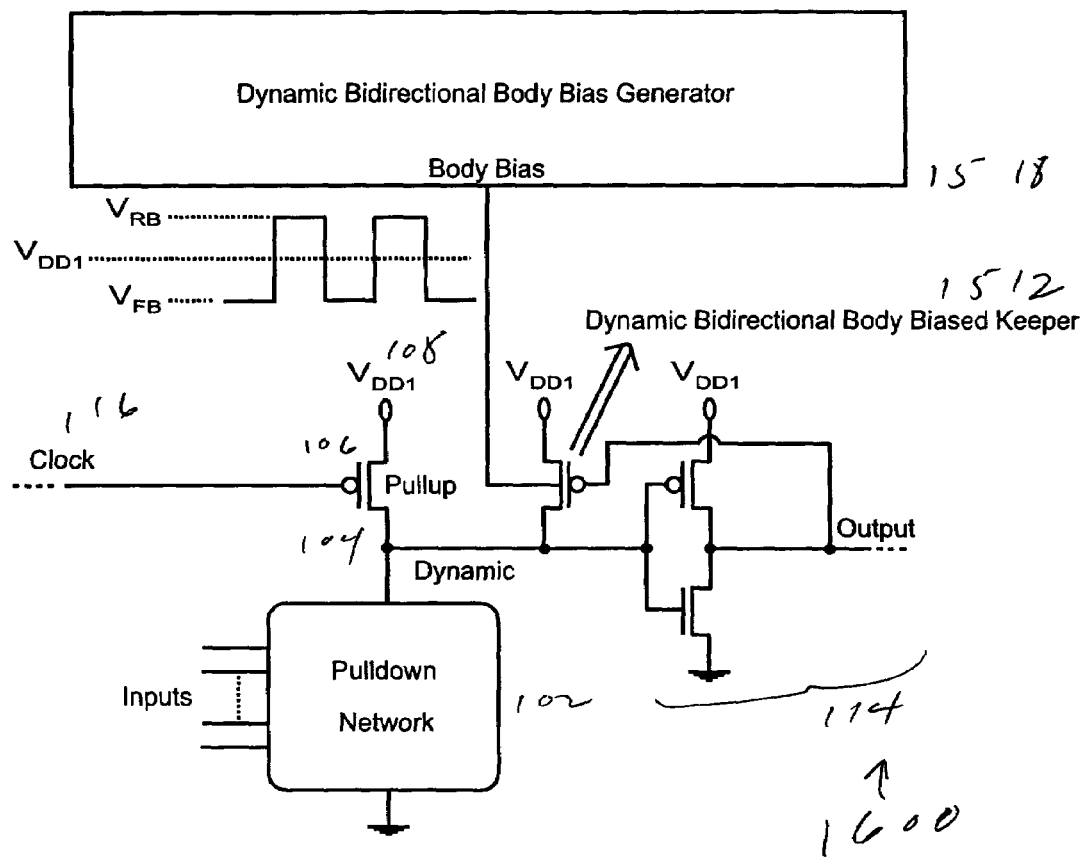
Fig. 16. A footless domino logic circuit based on the dynamic bidirectional body biased keeper domino logic (DBBBKD) circuit technique.
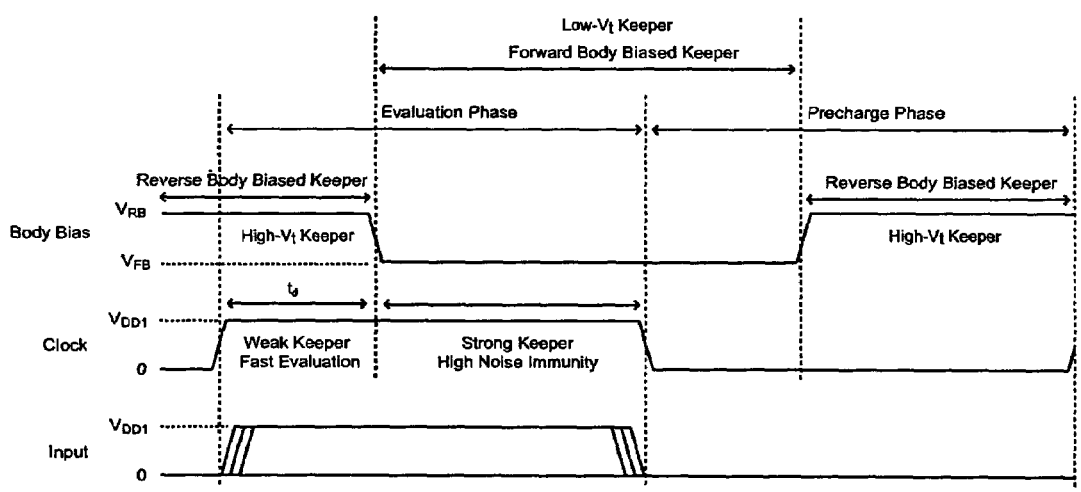
Fig. 17. Waveforms that characterize the operation of the proposed dynamic bidirectional body biased keeper domino logic (DBBBKD) circuit technique ($V_{FB} < V_{DD1} < V_{RB}$).

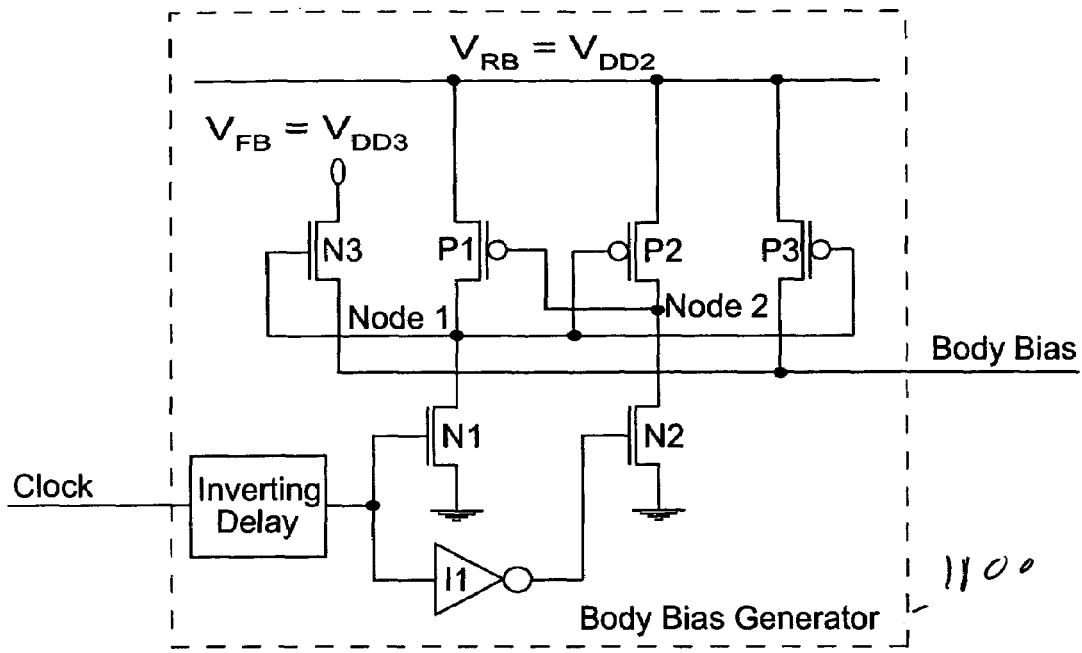

Fig. 18. A body bias generator applicable to the proposed dynamic bidirectional body biased keeper domino logic (DBBBKD) circuit technique [$V_{DD3} < V_{DD1} < V_{DD2}$ and $V_{tN3} < (V_{DD2}-V_{DD3})$].

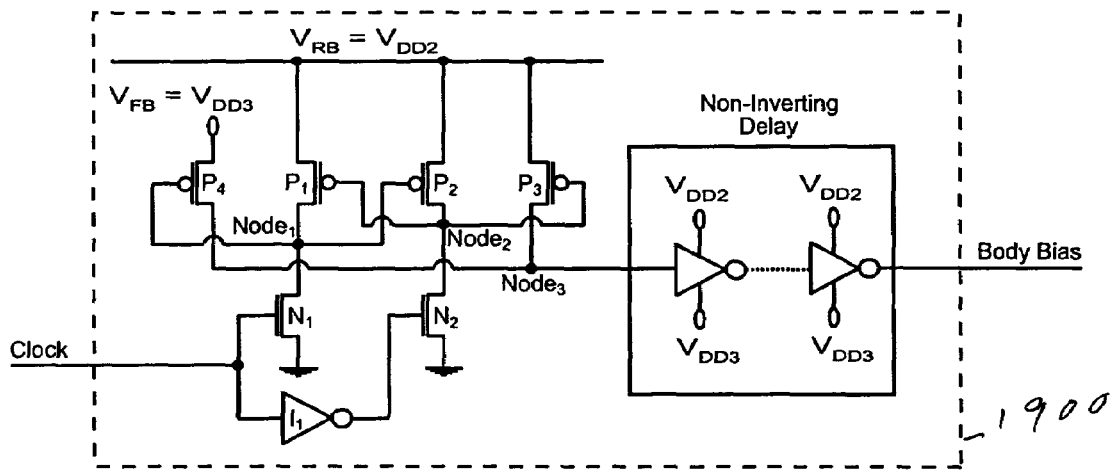

Fig. 19. A body bias generator applicable to the proposed dynamic bidirectional body biased keeper domino logic (DBBBKD) circuit technique ($V_{DD3} < V_{DD1} < V_{DD2}$). The body of $P_4$ can be connected either to $V_{DD2}$ or to $Node_3$ in order to not turn on the source-to-body diode of $P_4$ when $Node_3$ transitions to $V_{DD2}$.

DOMINO LOGIC WITH VARIABLE THRESHOLD VOLTAGE KEEPER

REFERENCE TO RELATED APPLICATION

The present invention claims the benefit of U.S. Provisional Application No. 60/391,953, filed Jun. 28, 2002, whose disclosure is hereby incorporated by reference in its entirety into the present disclosure.

STATEMENT OF GOVERNMENT INTEREST

The research leading to the present invention was supported in part by the DARPA/ITO under AFRL Contract F29601-00-K-0182. The government has certain rights in the invention.

DESCRIPTION OF RELATED ART

Domino logic circuit techniques are extensively applied in high performance microprocessors due to the superior speed and area characteristics of domino CMOS circuits as compared to static CMOS circuits. High speed operation of domino logic circuits is primarily due to the lower noise margins of domino circuits as compared to static gates. This desirable property of a lower noise margin, however, makes domino logic circuits highly sensitive to noise as compared to static gates. As on-chip noise becomes more severe with technology scaling and increasing operating frequencies, error free operation of domino logic circuits has become a major challenge.

Threshold voltage reduction accompanies supply voltage scaling, providing enhanced speed while maintaining dynamic power consumption within acceptable levels in each new integrated circuit technology generation. Scaling the threshold voltage, however, degrades the noise immunity of domino logic gates. Moreover, exponentially increasing subthreshold leakage currents with reduced threshold voltages have become an important issue threatening the reliable operation of deep submicrometer (DSM) dynamic circuits.

In a standard domino logic gate, a feedback keeper is employed to maintain the state of the dynamic node against coupling noise, charge sharing, and subthreshold leakage current. The keeper transistor is fully turned on at the beginning of the evaluation phase. Provided that the necessary input combination to discharge the dynamic node is applied, the keeper and pulldown network transistors compete to determine the logical state of the dynamic node. This contention between the keeper and the pulldown network transistors degrades the circuit speed and power characteristics. The keeper transistor is typically sized smaller than the pulldown network transistors in order to minimize the delay and power degradation due to the keeper contention current. A small keeper, however, cannot provide the necessary noise immunity for reliable operation in an increasingly noisy and noise sensitive on-chip environment. There is, therefore, a tradeoff between reliability and high speed/energy efficient operation in domino logic circuits.

To reduce contention current, a multi-phase keeper technique has been proposed. Employing two keeper transistors (an unconditional keeper and a conditional keeper), one of which is conditionally turned on if the dynamic node is not discharged during the evaluation phase, permits the contention current to be reduced. The unconditional keeper, however, needs to be sized closer to a standard domino (SD) keeper to maintain comparable noise immunity, thereby reducing any speed and power advantages of this technique.

A similar technique which turns off the keeper at the beginning of the evaluation phase has been proposed. The dynamic node floats at the beginning of the evaluation phase. Therefore, although the contention current is reduced, reliable operation cannot be maintained in an increasingly noisy and noise sensitive on-chip environment.

SUMMARY OF THE INVENTION

It will be readily apparent from the above that a need exists in the art to improve the tradeoff between noise immunity and high-speed, energy-efficient operation.

It is therefore an object of the invention to provide a domino logic circuit which reduces the contention current in order to lower the delay and power while maintaining reliable operation as compared to a standard domino logic circuit, in an increasingly noisy and noise-sensitive on-chip environment.

Another objective of the invention is to enhance the noise immunity without degrading the delay and power characteristics as compared to a standard domino logic circuit.

It is a further object of the invention to remove the need to use two keepers or to allow the dynamic node to float.

To achieve the above and other objects, the present invention is directed to a domino logic structure with a dynamic body biased keeper (also called a variable threshold voltage keeper) for power reduction, speed enhancement, or noise immunity increase. The threshold voltage of the keeper transistor is dynamically modified during circuit operation either to reduce the contention current without degrading the noise immunity or to enhance the noise immunity without degrading the power and delay characteristics as compared to standard domino logic circuits. More generally, the invention is directed to a domino logic structure in which a body bias is generated and applied to the keeper; in certain preferred embodiments, the body bias goes as a square wave.

Several high speed and low power domino logic circuit techniques are proposed. These proposed circuit techniques dynamically change the threshold voltage of a keeper transistor at the beginning of each operational phase (precharge and evaluation) by modifying the body bias voltage of the keeper transistor.

The first proposed domino logic circuit technique is called the reverse body biased keeper domino logic (RBBKD) circuit technique. The RBBKD circuit technique reverse body biases a keeper transistor in order to reduce the contention current. The reverse body biased keeper domino logic (RBBKD) circuit technique increases the threshold voltage of a keeper transistor, thereby reducing the drain current of the keeper. An RBBKD circuit has a lower evaluation delay and power characteristics as compared to a standard domino logic (SD) circuit. The RBBKD circuit technique, however, also lowers the noise immunity as compared to a standard domino logic circuit.

A second circuit technique, called the dynamically reverse body biased keeper domino logic (DRBBKD) circuit technique, is proposed. The DRBBKD circuit technique dynamically either reverse body biases or zero body biases a keeper transistor in order to reduce the contention current without sacrificing the noise immunity as compared to a standard domino logic circuit. The body bias voltage of a keeper transistor is dynamically changed between two pre-determined values. The contention current of a keeper is reduced by increasing the keeper threshold voltage by applying a reverse body bias to the keeper at the beginning of the evaluation phase. Similarly, the degradation in noise immunity as compared to a standard domino logic (SD) circuit is avoided by dynamically reducing the keeper threshold voltage to the zero body bias level after a delay greater than the worst case evaluation delay of the domino logic circuit.

Significant speed enhancement and power reductions are observed with the DRBBKD circuit technique when the keeper is sized for increased noise immunity. The current drive of the keeper transistor is dynamically adjusted with the proposed DRBBKD circuit technique. The threshold voltage of the keeper transistor is modified during circuit operation to reduce the contention current without sacrificing noise immunity. The keeper size can be increased while preserving the same delay or power characteristics as compared to a standard domino circuit since the contention current is reduced with the proposed DRBBKD technique. The proposed DRBBKD circuit technique offers higher noise immunity under the same delay, power, or power-delay product conditions, respectively, as compared to a standard domino logic circuit technique.

A third domino logic circuit technique, called the forward body biased keeper domino logic (FBBKD) circuit technique, is proposed. The threshold voltage of a forward body biased MOSFET is reduced, increasing the conduction current as compared to a zero (or reverse) body biased transistor. Forward body biasing the keeper with the FBBKD circuit technique, therefore, improves the noise immunity characteristics as compared to a standard domino logic circuit. Forward body biasing a keeper transistor, however, also increases the evaluation delay and power as compared to a standard domino logic circuit.

A fourth domino logic circuit technique, called the dynamically forward body biased keeper domino logic (DFBBKD) circuit technique, is proposed. The DFBBKD circuit technique dynamically applies either a forward body bias and or a zero body bias to a keeper transistor. With the proposed DFBBKD circuit technique, the keeper transistor is zero body biased in the precharge phase. When the clock signal transitions high, the evaluation phase begins. Provided that the necessary input combination to discharge the dynamic node is applied, the contention current of this zero body biased keeper transistor is similar to a keeper transistor in a standard domino logic circuit. The delay and power characteristics of the DFBBKD and SD circuit techniques are, therefore, similar in the evaluation phase. After a delay determined by the worst case evaluation delay of a domino logic circuit, the keeper is dynamically forward body biased with the proposed DFBBKD circuit technique in order to reduce the threshold voltage of a keeper transistor. Provided that the domino circuit does not evaluate in the evaluation phase, drain current of the keeper transistor is increased with the proposed DFBBKD circuit technique. The noise immunity of a domino logic circuit is, therefore, enhanced with the proposed DFBBKD circuit technique without degrading the evaluation delay and power characteristics as compared to a standard domino logic circuit.

A fifth variable threshold voltage keeper circuit technique, called the dynamically bidirectional body biased keeper domino logic (DBBBKD) circuit technique, is proposed. The DBBBKD circuit technique dynamically forward and reverse body biases a keeper transistor in order to improve the noise immunity, delay, and power characteristics as compared to a standard domino circuit. Similar to the RBBKD and DRBBKD circuit techniques, the DBBBKD circuit technique proposes reverse body biasing the keeper at the beginning of the evaluation phase for reducing the contention current and thereby improving the speed and power characteristics of a domino logic circuit. The contention current of a keeper is reduced by increasing the keeper threshold voltage by applying a reverse body bias to the keeper at the beginning of the evaluation phase. However, unlike the DRBBKD circuit technique, with the DBBBKD circuit technique a keeper transistor is forward body biased after the worst case evaluation delay of a domino circuit in order to improve the noise immunity characteristics as compared to a standard domino logic circuit.

A body bias generator is necessary to modify the body bias voltage of a keeper transistor with the proposed DRBBKD, DFBBKD, and DBBBKD circuit techniques. Two different body bias voltage generator circuits applicable to the DRBBKD, DFBBKD, and DBBBKD circuit techniques are proposed. The proposed body bias generator circuits are connected to the clock to generate one of two body bias voltages, depending on whether the clock is low or high, to control the threshold voltage of the keeper.

The disclosed circuit technique has been applied to wide fan-in domino OR gates. With the disclosed dynamic body biased keeper circuit technique, the evaluation speed is enhanced by up to 66% while reducing the power dissipation by 43% as compared to standard domino logic circuits.

The authors have written the following papers, whose disclosures are hereby incorporated by reference in their entireties into the present disclosure:

1. V. Kursun and E. G. Friedman, "Domino Logic with Variable Threshold Voltage Keeper," IEEE Transactions on Very Large Scale Integration (VLSI) Systems (in press).
2. V. Kursun and E. G. Friedman, "Variable Threshold Voltage Keeper for Contention Reduction in Dynamic Circuits," Proceedings of the IEEE International ASIC/SOC Conference," pp. 314–318, September 2002.
3. V. Kursun and E. G. Friedman, "Domino Logic with Dynamic Body Biased Keeper," Proceedings of the European Solid-State Circuits Conference," pp. 675–678, September 2002.

BRIEF DESCRIPTION OF THE DRAWINGS

Preferred embodiments of the invention and variations thereof will be disclosed in detail with reference to the drawings, in which:

A block diagram of a footed domino logic circuit according to the first preferred embodiment is shown in FIG. 1.

Figure 20A:
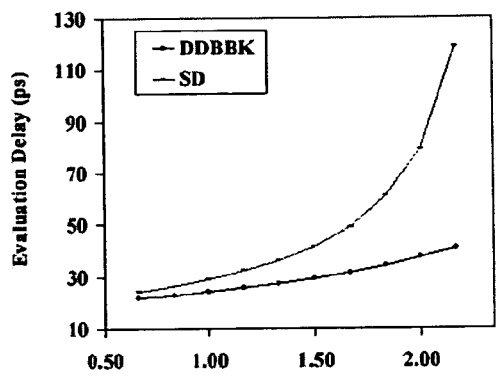

A block diagram of a footless domino logic circuit according to the first preferred embodiment is shown in FIG. 2.

A block diagram of a footed domino logic circuit according to the second preferred embodiment is shown in FIG. 3.

A block diagram of a footless domino logic circuit according to the second preferred embodiment is shown in FIG. 4.

A representative waveform to describe the operation of the circuits of FIGS. 3 and 4 is shown in FIG. 5.

A block diagram of a body bias generator according to the second preferred embodiment is shown in FIG. 6.

A block diagram of another body bias generator according to the second preferred embodiment is shown in FIG. 7.

A block diagram of a footed domino logic circuit according to the third preferred embodiment is shown in FIG. 8.

A block diagram of a footless domino logic circuit according to the third preferred embodiment is shown in FIG. 9.

A block diagram of a footed domino logic circuit according to the fourth preferred embodiment is shown in FIG. 10.

A block diagram of a footless domino logic circuit according to the fourth preferred embodiment is shown in FIG. 11.

A representative waveform to describe the operation of the DFBBKD circuit technique is shown in FIG. 12.

A block diagram of a body bias generator according to the eighth preferred embodiment is shown in FIG. 13.

A block diagram of a body bias generator according to the ninth preferred embodiment is shown in FIG. 14.

A block diagram of a footed domino logic circuit according to the fifth preferred embodiment is shown in FIG. 15.

A block diagram of a footless domino logic circuit according to the fifth preferred embodiment is shown in FIG. 16.

A representative waveform to describe the operation of the circuits of FIGS. 15 and 16 is shown in FIG. 17.

A block diagram of a body bias generator according to the fifth preferred embodiment is shown in FIG. 18.

A block diagram of another body bias generator according to the fifth preferred embodiment is shown in FIG. 19.

Simulation results are shown in FIGS. 20A–20D.

DETAILED DESCRIPTION OF THE PREFERRED EMBODIMENT

Five preferred embodiments and variations of each will now be disclosed with reference to the drawings, in which like reference numerals refer to like elements throughout.

The footed and footless variants of the first preferred embodiment, shown in FIGS. 1 and 2, respectively, implement a reverse body biased keeper domino logic (RBBKD) circuit technique. In the circuits 100 and 200 of FIGS. 1 and 2, a pulldown network 102, which can be any suitable pulldown network, is connected through a dynamic node 104 and a pullup 106 to a source 108 of source voltage $V_{DD1}$. In the circuit 100 of FIG. 1, the pulldown circuit 102 is connected to ground through a foot 110, while in the circuit 200 of FIG. 2, the pulldown circuit is connected directly to ground. The dynamic node 104 is also connected to $V_{DD1}$ through a reverse body biased keeper 112. The keeper 112 is biased by a reverse body bias voltage $V_{RB}>V_{DD1}$. The dynamic node 104 is further connected to an ouput circuit 114, whose output is fed back to gate the keeper 112. The pullup 106 and, in the circuit 100, the foot 110 are gated by a clock 116.

The footed and footless variants of the second preferred embodiment, shown in FIGS. 3 and 4, respectively, implement a dynamic reverse body biased keeper domino logic (DRBBKD) circuit technique. The circuits 300 and 400 of FIGS. 3 and 4 differ from the circuits 100 and 200 of FIGS. 1 and 2 in that the bias voltage is supplied by a dynamic reverse body bias generator 318 and is essentially a square-wave signal alternating between $V_{DD1}$ and $V_{RB}$. FIG. 5 shows waveforms characterizing the operation of the circuits 300 and 400.

The body bias generator 318 can be implemented as either the circuit 600 of FIG. 6 or the circuit 700 of FIG. 7. In the circuit 600, $V_{DD1}<V_{DD2}$, $V_{DD2}=V_{RB}$, and $V_{tN3}<(V_{DD2}-V_{DD1})$. In the circuit 700, $V_{DD1}<V_{DD2}$. The body of $P_4$ can be connected either to $V_{DD2}$ or to $Node_3$ in order to not turn on the source-to-body diode of $P_4$ when $Node_3$ transitions to $V_{DD2}$.

The circuit 600 is built around three nodes: Node 1, Node 2 and Node 3. Node 1 and Node 2 are connected to ground through N1 and N2, respectively. The clock 116 is supplied to an inverting delay 602, from which the inverted and delayed clock gates N1 directly and N2 through an inverter I1.

Node 1, Node 2 and Node 3 are connected to $V_{RB}$ through P1, P2 and P3, respectively. Node 3 is also connected to $V_{DD1}$ through N3. Node 1 gates N3, P2 and P3, while Node 2 gates P1.

In the circuit of FIG. 6, Node 3 is connected alternately to $V_{DD1}$ and $V_{RB}$. Since Node 3 supplies the body bias to the keeper, the keeper is alternately biased by those two voltages.

The circuit 700 of FIG. 7 differs from the circuit 600 of FIG. 6 in the following respects. The inverting delay 602 is not used; instead, an output from Node 3 is delayed by a non-inverting delay 702 before being supplied to the keeper. N3 is replaced by P4. Node 1 gates P2 and P4, while Node 2 gates P1 and P3. As noted above, the body of $P_4$ can be connected either to $V_{DD2}$ or to $Node_3$ in order to not turn on the source-to-body diode of $P_4$ when $Node_3$ transitions to $V_{DD2}$.

FIGS. 8 and 9 show, respectively, a footed circuit 800 and a footless circuit 900 of the third preferred embodiment, which implements a forward body biased keeper domino logic (FBBKD) circuit technique. The circuits 800 and 900 differ from the circuits 100 and 200 of the first preferred embodiment in that a forward body biased keeper 812 is biased by a forward body bias voltage $V_{FB}<V_{DD1}$.

FIGS. 10 and 11 show, respectively, a footed circuit 1000 and a footless circuit 1100 of the fourth preferred embodiment, which implements a dynamic forward body biased keeper domino logic (DFBBKD) circuit technique. The circuits 1000 and 1100 differ from the circuits 800 and 900 in that the body bias supplied to the keeper 812 comes from a dynamic forward body bias generator 1018 such that the body bias varies between $V_{FB}$ and $V_{DD1}$. FIG. 12 shows the waveforms which characterize the operation of the circuits 1000 and 1100.

The dynamic forward body bias generator 1018 can be implemented as the circuit 1300 of FIG. 13 or the circuit 1400 of FIG. 14. In the circuit 1300, $V_{DD3}<V_{DD1}$ and $V_{tN3}<(V_{DD1}-V_{DD3})$. In the circuit 1400, $V_{DD3}<V_{DD1}$. Except for the differences shown and described, the circuits 1300 and 1400 can be configured like the circuits 600 and 700 of FIGS. 6 and 7.

FIGS. 15 and 16 show, respectively, a footed circuit 1500 and a footless circuit 1600 of the fifth preferred embodiment, which implements a dynamic bidirectional body biased keeper domino logic (DBBBKD) circuit technique. The circuits 1500 and 1600 differ from those previously discussed in that the body bias supplied to the keeper 1512 comes from a dynamic bi-directional body bias generator 1518 and alternates between $V_{FB}$ and $V_{RB}$. FIG. 17 shows the waveforms which characterize the operation of the circuits 1500 and 1600.

The dynamic bi-directional body bias generator 1518 can be implemented as the circuit 1800 of FIG. 18 or the circuit 1900 of FIG. 19. In the circuit 1800 of FIG. 18, $V_{DD3}<V_{DD1}<V_{DD2}$ and $V_{tN3}<(V_{DD2}-V_{DD3})$. In the circuit 1900 of FIG. 19, $V_{DD3}<V_{DD1}<V_{DD2}$. The body of $P_4$ can be connected either to $V_{DD2}$ or to $Node_3$ in order to not turn on the source-to-body diode of $P_4$ when $Node_3$ transitions to $V_{DD2}$.

Various ones of the preferred embodiments operate in the following manner. When the clock is low, the pullup is on, and the dynamic node is charged to $V_{DD1}$. The substrate of the keeper is charged to the body bias by the body bias generator, changing the keeper threshold voltage. The value of the high threshold voltage (high-$V_t$) of the keeper is determined by the body bias voltage applied to the source-to-substrate p-n junction of the keeper. The current sourced by the high-$V_t$ keeper is reduced, lowering the contention current when the evaluation phase starts. A reduction in the current drive of the keeper does not degrade the noise immunity during precharge, as the dynamic node voltage is maintained during this phase by the pullup rather than the keeper.

When the clock goes high (the evaluation phase), the pullup is cut off, and only a high-$V_t$ keeper current contends with the current from the evaluation path transistor(s). Provided that the appropriate input combination that discharges the dynamic node is applied in the evaluation phase, the contention current due to the high-$V_t$ keeper is significantly reduced as compared to standard domino. After a delay determined by the worst case evaluation delay of the domino gate, the body bias voltage of the keeper is changed, zero biasing the source-to-substrate p-n junction of the keeper. The threshold voltage of the keeper is, therefore, lowered to the zero body bias level, thereby increasing the keeper current. The keeper has the same threshold voltage as a standard domino keeper, offering the same noise immunity during the remaining portion of the evaluation stage.

The body bias generator generates the proper body bias voltages for the keeper with an appropriate delay, ensuring that the contention current is reduced without sacrificing noise immunity.

The operation of the body bias generator is controlled by the clock signal that also controls the operational phases of the domino logic circuit. The clock determines which node is discharged through N1 or N2. The body bias generator must ensure during the evaluation stage that the keeper current is increased to the lower threshold voltage level (by removing the reverse body bias) for higher noise immunity if the dynamic node is not discharged by the evaluation path transistors. After a delay determined by the worst case evaluation delay of the domino gate, the body bias generator returns to the initial state, and the body bias voltage is (eventually) reduced to $V_{DD1}$. Hence, with a time delay $t_D$ after the clock edge, the threshold voltage of the keeper is reduced to the zero body bias level, increasing the keeper current. During the remaining portion of the evaluation phase, therefore, the noise immunity characteristics of the present disclosed circuit techniques and of the prior art are identical.

The dynamic body bias generator is operational for a wide range of values of $V_{DD1}$ and $V_{DD2}$. Reductions in the delay and power can be increased by increasing $V_{DD2}$ as compared to $V_{DD1}$. This change, however, also degrades the noise immunity characteristics of the domino circuit at the beginning of the evaluation phase. The appropriate reverse body bias that is applied to the keeper is determined by the target delay/power objectives while satisfying the lowest acceptable noise immunity requirement during the worst case evaluation delay of the domino gate. The highest reverse bias that can be applied to the source-to-substrate junction and gate oxide of a PMOS transistor for a specific technology are the other factors that determine $V_{DD2}$. In the following analysis, $V_{DD2}$ is chosen to be twice $V_{DD1}$, making the maximum keeper reverse body bias voltage equal to $V_{DD1}$. Significant delay and power savings are achieved with a small degradation in noise immunity of less than 11% at the beginning of the evaluation phase.

The SD and DDBBK circuit techniques are evaluated for an eight input OR gate assuming a 0.18 μm CMOS technology. Each domino gate drives a capacitive load of 18 fF. A 1 GHz clock with a 50% duty cycle is applied to the domino logic circuits. All of the common transistors in the SD and DDBBK circuits are sized the same. All of the transistors in the dynamic body bias generator are minimum size. $V_{DD1}$ and $V_{DD2}$ are 1.8 volts and 3.6 volts, respectively.

To evaluate the noise immunity, a DC analysis of each circuit configuration has been evaluated. The low noise margin (NML) is used as the noise immunity metric during this analysis. The NML is defined as $$NML = V_{IL} - V_{OL},$$

where $V_{IL}$ is the input low voltage defined as the lower DC input voltage at which the rate of change of the dynamic node voltage with respect to the input voltage is equal to one (the unity gain point on the voltage transfer characteristic). $V_{OL}$ is the output low voltage.

The keeper width is a multiple of the width of a single NMOS transistor in the pulldown network and is varied to evaluate the delay, power, and noise immunity tradeoffs. During evaluation of the delay and power characteristics, only one input of the eight input OR gate is asserted while the remaining inputs are grounded. This situation represents the worst case delay condition. During evaluation of the noise immunity, the same input noise signal is applied to all eight inputs as this situation represents the worst case noise condition for a domino OR gate. The evaluation delay, power, power-delay product (PDP), and NML for SD and DDBBK as a function of the keeper to pulldown transistor width ratio (KPR) are shown in FIGS. 20A–20D. The gain in delay, power, and PDP achieved by the proposed technique together with the degradation in noise margin at the beginning of the evaluation phase while a maximum reverse body bias is applied to the keeper are listed in Table 1.

TABLE 1

|  | Evaluation delay (ps) | Power (μW) | PDP (fJ) | NML (mV) |
| --- | --- | --- | --- | --- |
| SD | 119 | 1540 | 183 | 462 |
| DDBBK | 41 | 883 | 36 | 409 |
| Improvement | 66% | 43% | 80% | −11% |

The proposed dynamic body biased keeper technique is effective for enhancing the evaluation speed of domino logic circuits. As listed in Table 1, DDBBK improves the evaluation delay by 66% as compared to SD (for a KPR=2.2). As shown in FIG. 20A, the effectiveness of the proposed technique increases with larger keeper size as the degradation in circuit speed becomes more severe due to increased contention. The enhancement in circuit speed is reduced to 10% as the KPR is reduced to 0.6.

Figure 20B:
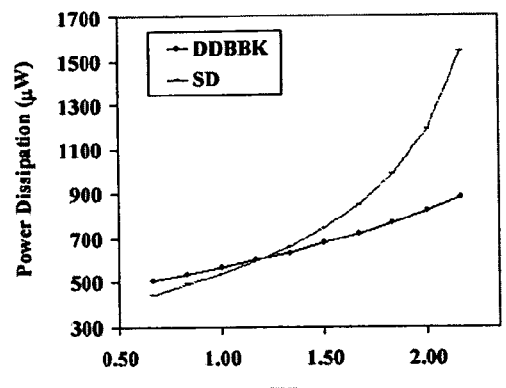

As shown in FIG. 20B, the proposed circuit technique also lowers the power consumption for a wide range of keeper sizes. As listed in Table 1, DDBBK reduces the power by 43% as compared to SD (for a KPR=2.2). As the keeper size is decreased, the effect of the keeper contention on the evaluation delay and circuit energy dissipation becomes smaller. The reduction in power with small keeper sizes, therefore, diminishes. Due to the energy overhead of the dynamic body bias generator circuit, the power consumption increases by 14% as compared to SD when the KPR is reduced to 0.6.

The PDP of the circuits is also illustrated in FIGS. 20A–20D to better compare the effect of the proposed dynamic body biased circuit technique on circuit performance and energy dissipation. As listed in Table 1, DDBBK offers 80% lower PDP as compared to SD (for a KPR=2.2).

Figure 20C:
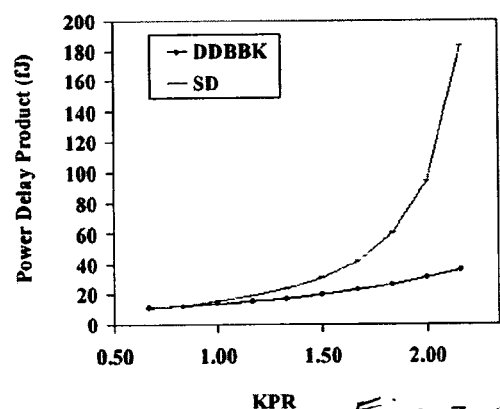

As shown in FIG. 20C, the only configuration at which the prior art (SD) has a smaller PDP as compared to DDBBK is for a KPR=0.6 (3% lower).

Figure 20D:
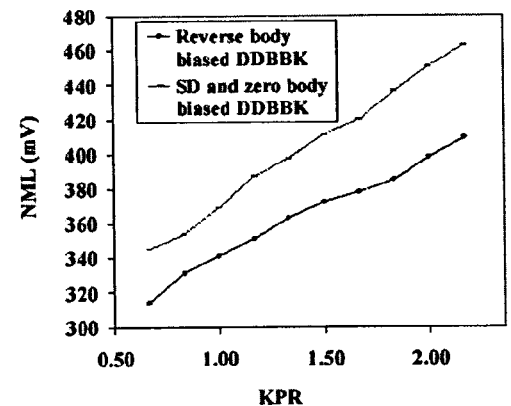

Another important metric for domino circuits is noise immunity. The proposed circuit technique slightly degrades the noise immunity as compared to SD only at the beginning of the evaluation phase. This degradation occurs for a brief amount of time until the threshold voltage of the keeper is lowered for increased noise immunity. The time delay ($t_D$) at the beginning of the evaluation cycle, after which the keeper current drive is increased to the low-$V_t$ level, is determined by the worst case evaluation delay of the domino gate. The degradation in noise immunity changes between 9% and 11% under maximum reverse body bias conditions as the KPR is increased from 0.6 to 2.2. As shown in FIG. 20D, the noise immunity of DDBBK is identical to the noise immunity of SD whenever a zero body bias is applied to the keeper.

The DDBBK technique is thus shown to operate at up to a 66% higher speed while consuming 43% less power as compared to SD. DDBBK also offers reductions in PDP of up to 80% as compared to SD. The degradation in noise immunity of DDBBK as compared to SD, observed when a reverse body bias is applied to the keeper, is less than 11%.

When the keeper transistor is forward body biased, the diode currents through the forward biased source-to-substrate and drain-to-substrate junctions of the keeper are increased. The current passing through the forward biased drain-to-substrate junction attempts to discharge the dynamic node while the drain current is charging the node. The drain-to-substrate current, therefore, reduces the net current supplied by the keeper to maintain the state of the dynamic node. The noise margin is greater at forward body bias voltages where the improvement in the keeper current with reduced threshold voltage dominates the increased drain-to-body junction current. The body diodes of a keeper transistor are strongly turned on for forward body bias voltages above 0.7 volts. As the forward body bias voltage is increased beyond 0.7 volts, the increased drain-to-body junction current begins to dominate the drain current of the keeper at low source-to-drain voltages. The DC operating point of the dynamic node is, therefore, reduced by more than 5% for forward body bias voltages higher than 0.7 volts (all of the pulldown transistors are cutoff).

When a noise or input signal is applied to the input(s) of a domino circuit, the dynamic node is discharged. The forward body bias across the drain-to-substrate p-n junction of the keeper is reduced. Eventually, the drain-to-body diode is reverse biased as the dynamic node is discharged. Alternatively, as the dynamic node is discharged, the source-to-drain voltage of the keeper is increased. $I_{drain}$, therefore, increases while $I_{diode2}$ decreases until the output switches and the keeper is turned off. The relative strength of the keeper drain current ($I_{drain}$) and the drain-to-substrate diode current ($I_{diode2}$) changes while the dynamic node is discharged. The operation of the keeper transistor shifts from the linear region to the saturation region while the operation of the drain diode moves from forward biased to reverse biased. The reduced DC operating point of a domino circuit for a small drain-to-source voltage, therefore, does not translate into a degradation in the low noise margin (NML). For example, although the DC operating point of the dynamic node is degraded by 10% when the keeper transistor is forward body biased by 0.8 volts (when all of the pulldown transistors are cut off), the NML is improved by 19.1% as compared to a domino logic circuit with a zero body biased keeper.

In FIG. 7 and FIG. 19, the body terminal of $P_4$ can be connected either to $V_{DD2}$ or to $Node_3$. The reason for these connections is to avoid turning on the source-to-body diode of $P_4$ when the voltage at $Node_3$ rises to $V_{DD2}$.

In FIG. 14, the body terminal of $P_4$ can be connected either to $V_{DD1}$ or to $Node_3$. The reason for preferring one of these connections is to avoid turning on the source-to-body diode of $P_4$ when the voltage at $Node_3$ rises to $V_{DD1}$.

Note that an NMOS transistor is used between $V_{DD1}$ and body bias output in FIG. 6. This connection assumes that the voltage difference between $V_{DD1}$ and $V_{DD2}$ is more than the threshold voltage ($V_{tN3}$) of an NMOS transistor. In FIG. 13, it is assumed that the difference between $V_{DD1}$ and $V_{DD3}$ is more than the threshold voltage ($V_{tN3}$) of an NMOS transistor. Similarly in FIG. 18, it is assumed that the voltage difference between $V_{DD2}$ and $V_{DD3}$ is more than the threshold voltage ($V_{tN3}$) of an NMOS transistor. N3 in FIGS. 6, 13, and 18 can be replaced by a PMOS transistor, provided that the gate of this PMOS transistor is connected to Node 2 (rather than Node 1). Please include different claims for these body bias generators also.

Alternatively, $P_4$ is FIGS. 7, 14, and 19 can be replaced by an NMOS transistor provided that the gate of this NMOS transistor is connected to Node2 (rather than Node1).

While preferred embodiments of the invention and variations thereon have been set forth in detail above, those skilled in the art who have reviewed the present disclosure will readily appreciate that other embodiments can be realized within the scope of the present invention. For example, while certain types of transistors have been disclosed, other suitable components can be used instead. Also, numerical values are illustrative rather than limiting, as are disclosures of specific pulldown circuits, since any suitable pulldown circuit can be

We claim:

1. A domino logic circuit comprising:
   a pulldown circuit having a dynamic node;
   a keeper connected to the pulldown circuit at the dynamic node; and
   a source of a body bias voltage, the source of the body bias voltage being connected to the keeper to supply the body bias voltage to the keeper to bias the keeper;
   wherein source supplies the body bias voltage such that the body bias voltage alternates between a first forward body bias voltage value and a second reverse body bias voltage value.

2. The domino logic circuit of claim 1, further comprising a foot transistor for connecting the pulldown circuit to ground.

3. The domino logic circuit of claim 1, wherein the pulldown circuit is connected to ground without an intervening foot transistor.

4. A domino logic circuit comprising:
   a pulldown circuit having a dynamic node;
   a keeper connected to the pulldown circuit at the dynamic node; and
   a source of a body bias voltage, the source of the body bias voltage being connected to the keeper to supply the body bias voltage to the keeper to bias the keeper;
   wherein the body bias voltage is a reverse body bias voltage;
   wherein the source supplies the reverse body bias voltage such that the reverse body bias voltage alternates between two values; and
   wherein the source supplies the reverse body bias voltage such that the reverse body bias voltage alternates between the two values in accordance with a clock signal applied to the domino logic circuit.

5. A domino logic circuit comprising:

a pulldown circuit having a dynamic node;

a keeper connected to the pulldown circuit at the dynamic node; and a source of a body bias voltage, the source of the body bias voltage being connected to the keeper to supply the body bias voltage to the keeper to bias the keeper;

wherein the source supplies the body bias voltage such that the body bias voltage alternates between two values; and wherein the source supplies the body bias voltage such that the body bias voltage alternates between the two values in accordance with a clock signal applied to the domino logic circuit.

6. The domino logic circuit of claim 1, wherein the source supplies the body bias voltage such that the body bias voltage alternates between the first forward body bias voltage and the second reverse body bias voltage in accordance with a clock signal applied to the domino logic circuit.

7. The domino logic circuit of claim 5, wherein the body bias voltage is a forward body bias voltage.

* * * * *